United States Patent [19]

Humphrey et al.

[11] Patent Number: 5,558,267
[45] Date of Patent: Sep. 24, 1996

[54] MOAT FOR DIE PAD CAVITY IN BOND STATION HEATER BLOCK

[75] Inventors: Henry L. Humphrey, Richardson; Richard L. Mahle, Dallas; Randall V. Tekavec, Garland, all of Tex.

[73] Assignee: Texas Instruments Incorporated, Dallas, Tex.

[21] Appl. No.: 414,704

[22] Filed: Mar. 31, 1995

[51] Int. Cl.⁶ .............................. H01L 21/60; B23K 37/04
[52] U.S. Cl. ............................................. 228/4.5; 228/44.7
[58] Field of Search ......................... 228/1.1, 4.5, 44.7, 228/49.5, 212; 156/73.2

[56] References Cited

U.S. PATENT DOCUMENTS 3,995,845  12/1976  Scheffer ........................... 228/44.7
5,201,450  4/1993  Ahn .................................. 228/4.5
5,249,726  10/1993  Sato ................................ 228/44.7

*Primary Examiner*—Samuel M. Heinrich
*Attorney, Agent, or Firm*—W. James Brady, III; Richard L. Donaldson

[57] ABSTRACT

A wire bond station has a platform (32) in cavity (31) of the work station heater block (30) on which a lead frame die mount pad (33) is placed during wire bonding to semiconductor chip mounted on the die mount pad. The platform (32) is of a dimension such that the edges of the die mount pad (33) extend out from the platform (32) so that irregularities (34) on the edges of the die mount pad (33) do not support the die mount pad (33) above the platform (32).

10 Claims, 6 Drawing Sheets

5,558,267

MOAT FOR DIE PAD CAVITY IN BOND STATION HEATER BLOCK

FIELD OF THE INVENTION

This invention relates to semiconductor device production, and more particularly to a bond station heater block having a moat to permit consistent ball bonding when lead frame die pads have edge burrs.

BACKGROUND OF THE INVENTION

In the process of stamping metal lead frames including the lead frame die pad, edge burrs and/or slightly irregular edges may be formed so that the die pad is not flat. The burrs or irregular edges prevent the die pad from being flat on the bond station heater block during wire bonding. Since the burr is not solid, ball bond sensing problems result during bonding. This non-flatness of the lead fame die pad on the heater block causes inconsistent bonding, ball sizes and heights.

SUMMARY OF THE INVENTION

The invention is to an improved wire bond station for accommodating irregularities on the edges of the lead frame die mount pad. A wire bond station including a heater block has a lead frame die mount pad mounting surface on said heater block for supporting a lead frame die mount pad. A moat surrounds said mounting surface such that the edges of the lead frame die mount pad, and irregularities thereon, extend beyond the mounting surface and are spaced above the bottom of the moat.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

Figure 1:
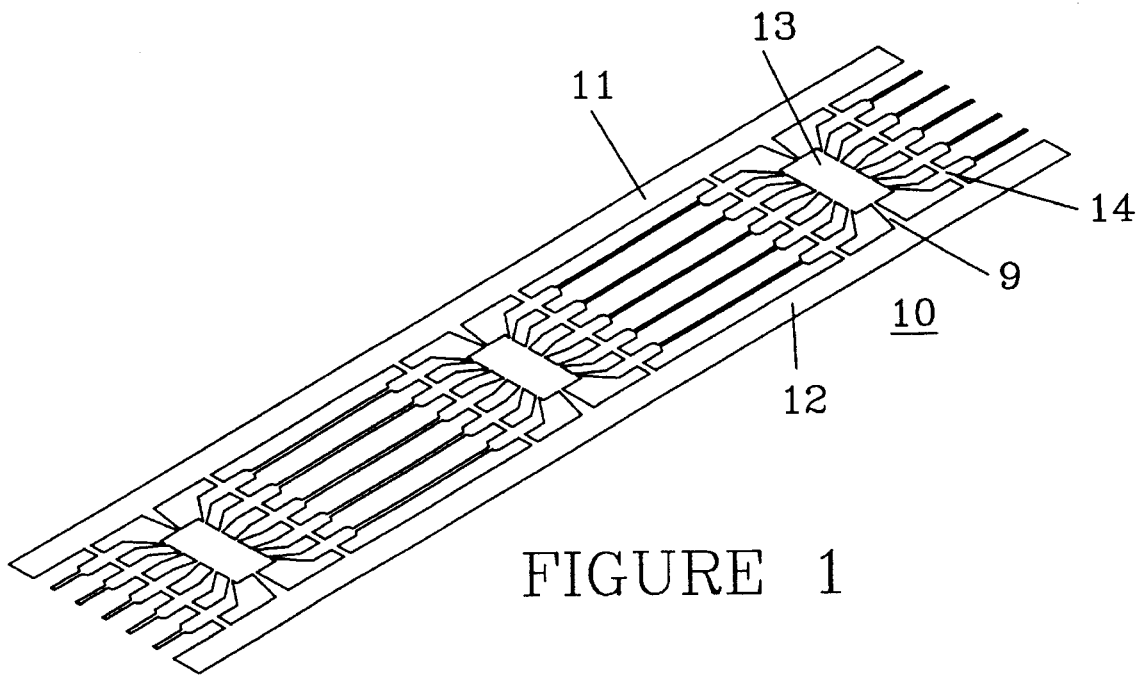
FIG. 1 shows a strip of lead frames used in semiconductor production.

FIG. 1 shows a strip of three lead frames 10. Each lead frame 10 has a die mount pad 13 and a plurality of leads 14. The lead frames are held in a strip by side rails 11 and 12.

Figure 1A:
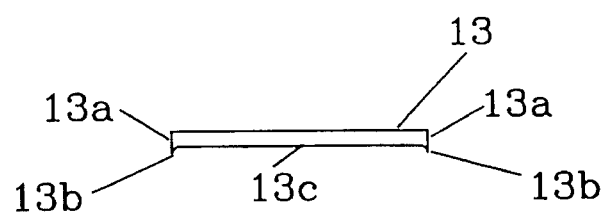
FIG. 1a shows edge burrs/irregularities on the edges of a stamped lead frame die pad.

FIG. 1a is a side view of die mount pad 13. When stamping lead frames from sheets of thin metal, the stamping die cuts through the sheet of metal to form the lead frame during the stamping operation. The stamping die shears the metal to perform the cut. As the stamping die becomes worn, the cut may not be as clean as desired and a burr or piece of extended metal is formed along the edges of the lead frame. Such burrs are illustrated in FIG. 1a where the edges 13a of the die pad 13 have small burrs 13b extending down from the flat surface of the die pad face 13c. Burrs 13b prevent face 13c from residing flat against a flat surface.

Figure 1B:
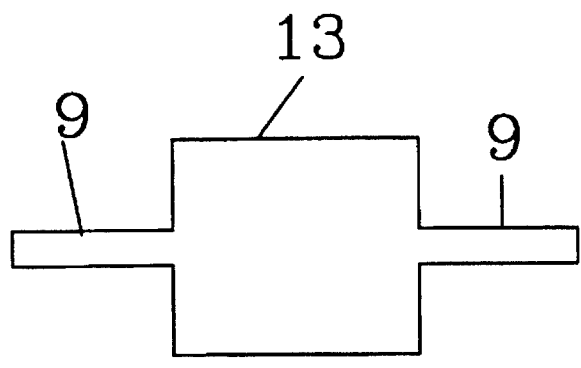
FIGS 1b, 1c and 1d are the top side and end views of a lead frame die pad showing the tie straps and burrs thereon.
Figure 1D:
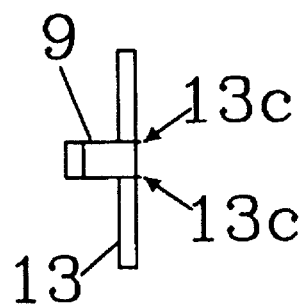
Figure 1C:
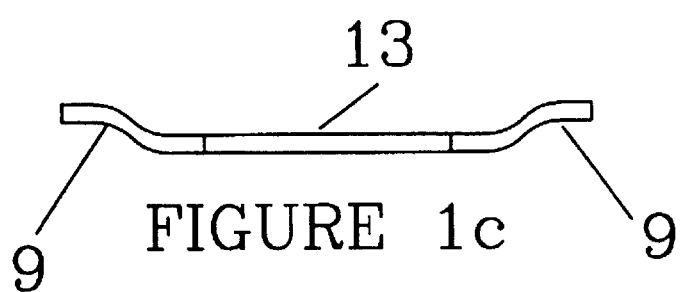

FIGS. 1b, 1c and 1d are top, side and end views of die mount pad 13 showing die mount pad tie straps 9 that hold die mount pad 13 in side rails 11 and 12 until the device has been packaged. Tie straps 9 may also have burrs 13c which hold die mount pad 13 slightly in a raised position during bonding.

Figure 2A:
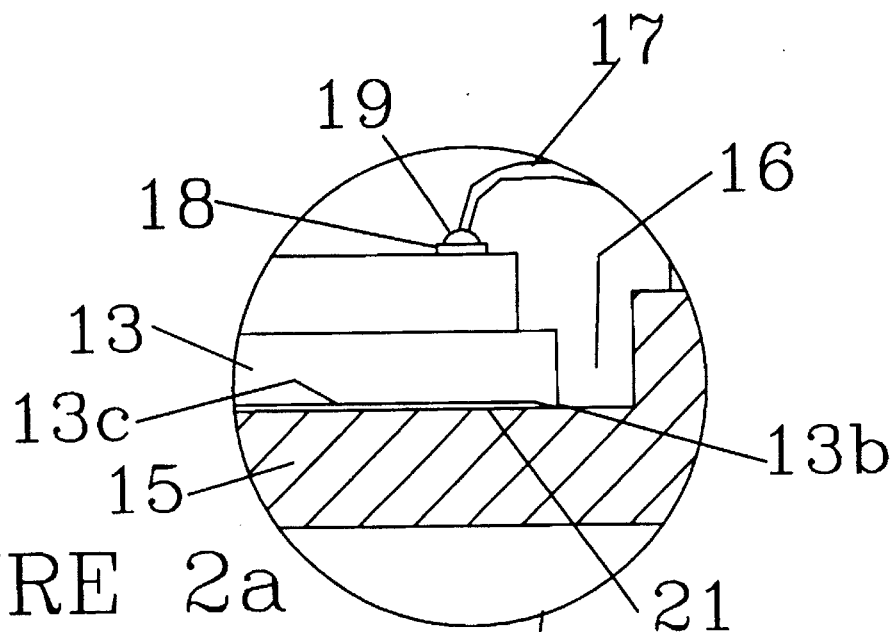
FIG. 2a is an enlarged view of the die pad with irregularities on the heater block.
Figure 2:
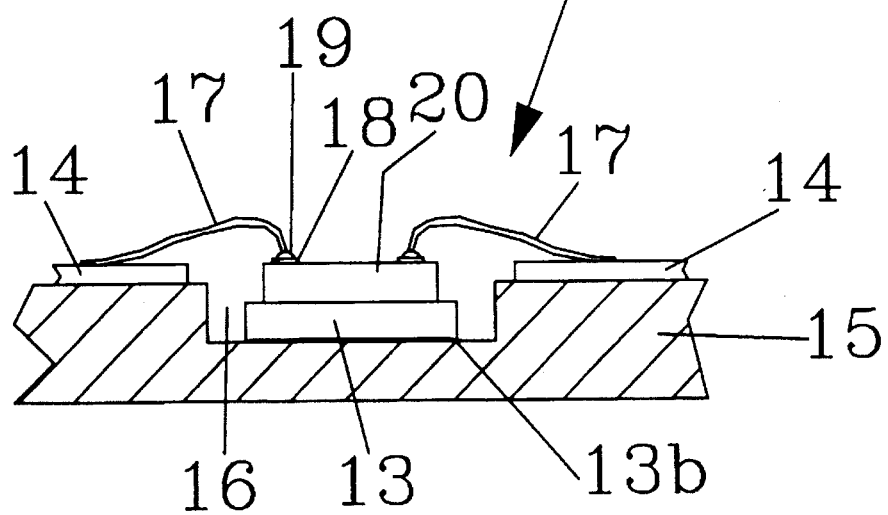
FIG. 2 shows a semiconductor die on a lead frame die pad, with edge irregularities, in a wire bonder work station heater block.

FIG. 2 is a partial view of a lead frame with a semiconductor chip 20 on a lead frame die pad 13. Die pad 13 is in cavity 16 of a bond station heater block 15. When a semiconductor chip is to be mounted and secured to a lead frame, the semiconductor chip 20 is mounted on the die pad 13 and lead wires 17 are bonded to the lead frame leads 14, and to contact pad 18 on the surface of semiconductor chip 20. During the bonding process, a downward pressure and ultrasonic power is applied to form the ball bond 19 between the lead wires 17 and the bond pad 18. The downward pressure is based upon a defined amount of pressure to form a desired bond having a specific ball size and height. Height is also used to determine bond pressure. However, when there is a burr 13b holding the face 13c of the die mount pad 13 above the surface 21 of heater block 15, the downward bond pressure may cause the burr to collapse and the die pad to move during bonding. This movement results in a decreased or variation in bond pressure during bonding, causing an improper or poor bond.

FIG. 2a is an enlarged view of part of the die pad 13, showing burr 13b holding the face 13c of die pad 13 above the surface 21 of heater block 15. While the space between the heater block surface 21 and die pad face 13c is small, the collapsing of burr 13b, or improper force application during touch down allows movement of the die pad 13 and semiconductor chip 14, resulting in an improper bonding pressure or improper application of ultrasonic energy during the bonding process.

Figure 3:
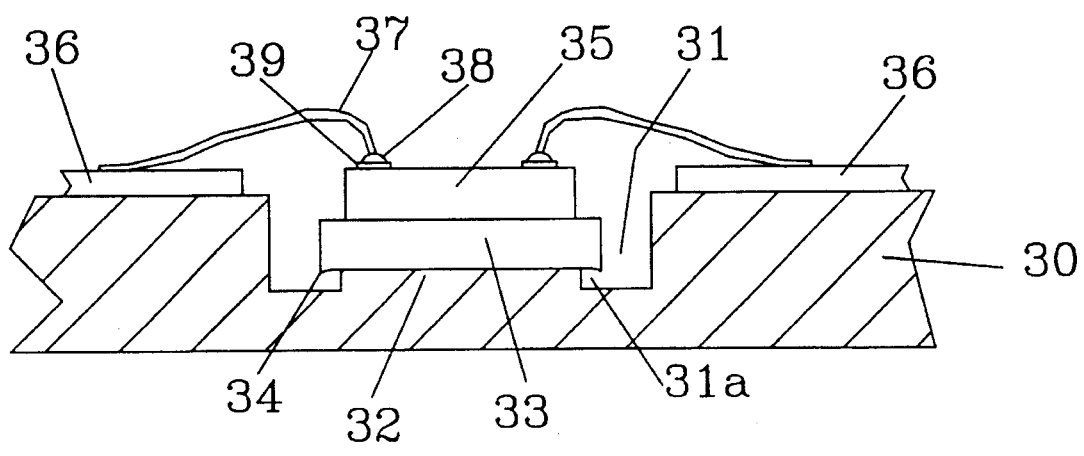
FIG. 3 shows a heater block with a moat to allow a die pad with irregularities to be flat during bonding.

FIG. 3 illustrates an embodiment of the invention wherein a bonder work station heater block 30 has a die pad cavity 31 with a raised platform 32. The lead frame die pad 33 is placed on raised platform 32 during bonding of the lead wires 37 between the lead frame leads 36 and the semiconductor chip 35. Raised platform 32 in die pad cavity 31 forms moat 31a into which the burrs 34 on die pad 33 extend when die pad 33 is on raised platform 33. When die pad 33 is placed on raised platform 32, lead frame die mount pad is flat on platform 32 and not held in a raised position by burrs 34. This allows for bonding of ball bond 38 utilizing a standard bond pressure. Since burrs 34 do not hold die pad mount 33 in a raised position, the bonding pressure does not cause die pad mount 33 to move downward under the bonding pressure.

Figure 4:
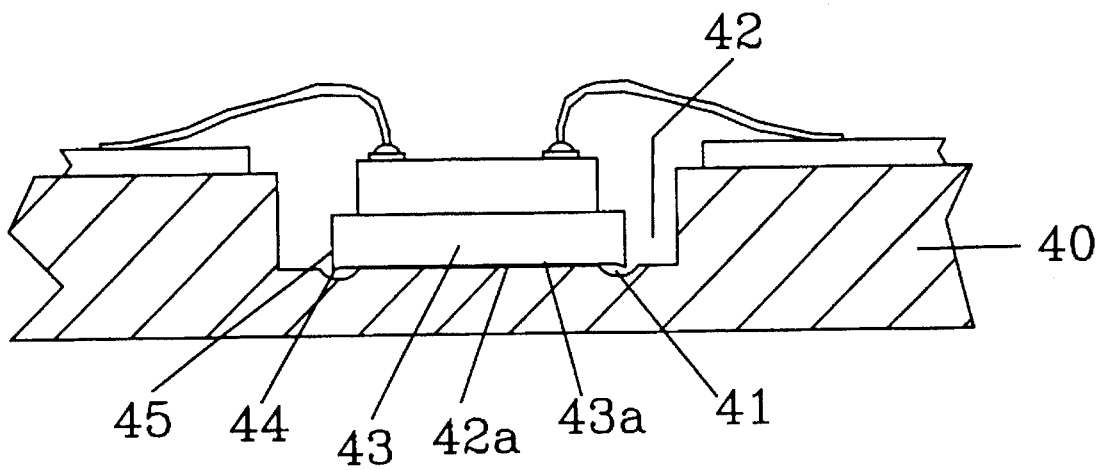
FIG. 4 is another embodiment of the invention with a moat around a flat die pad mounting surface.

FIG. 4 is another embodiment of the invention wherein a moat 41 is formed in the bottom of the die pad cavity 42 in the bond station heater block 40. Moat 41 is formed in a configuration such that the edges 45 of the die mount pad 43 extend over moat 41 so that the burrs or edge irregularities 44 extend downward into moat 41 allowing the bottom face 43a of die mount pad 43 to reside flat against the bottom 42a of die pad cavity 42. In practice, the moat will be rectangular in shape since die mount pads on most lead frames are rectangular, such as the die mount pad 13 illustrated in FIG. 1. The width of moat 41 can be of a dimension to accommodate various sizes of die mount pads. In this second embodiment, existing heater blocks can be modified by machining moat 41 into the bottom the die pad cavity 42.

Figure 4A:
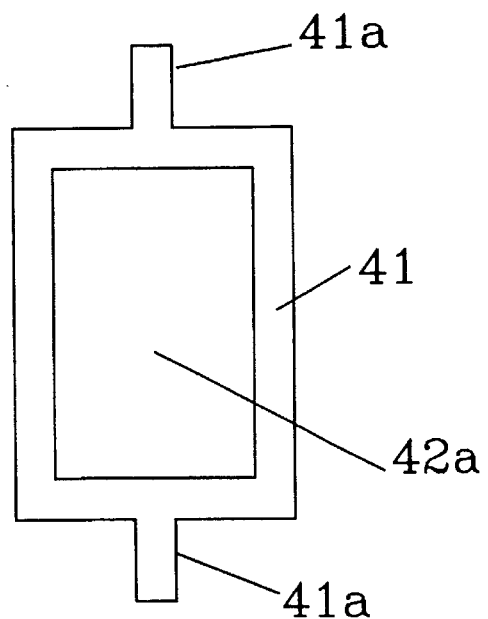
FIG. 4a shows a moat with an extend moat region to accommodate lead frame die mount pad support strips.

FIG. 4a shows the moat 41 of FIG. 4 with extensions 41a to the moat to accommodate the die pad tie straps 9 (FIGS. 1b–1d) during bonding. Moat extensions 41a prevent burrs 13c on the tie straps 9 from interfering during bonding.

Figure 5:
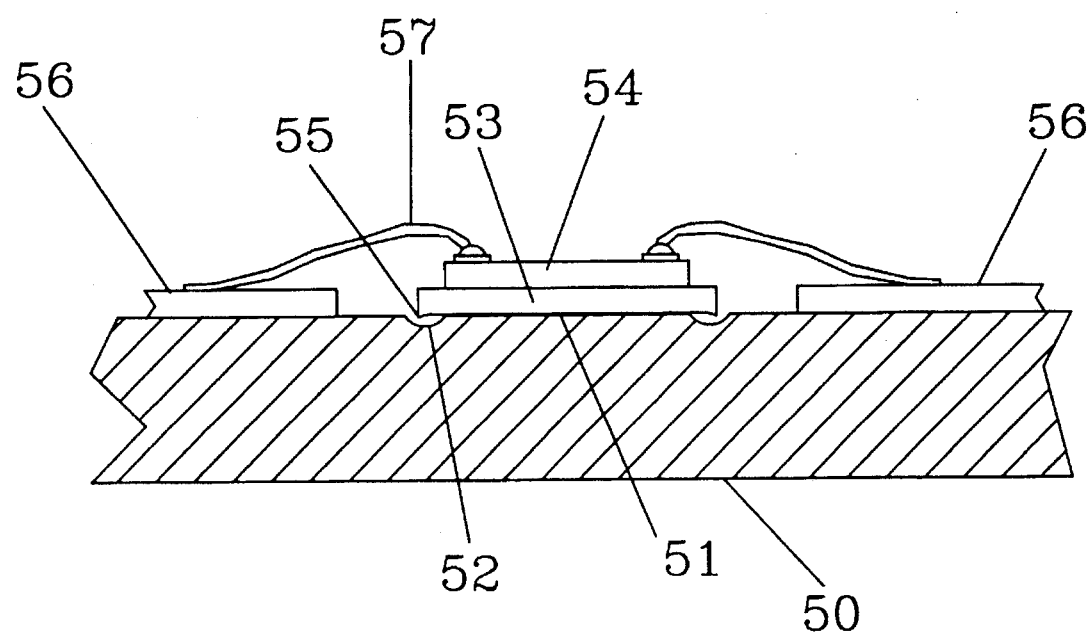
FIG. 5 is an additional embodiment of the invention wherein the heater block does not have a cavity.

FIG. 5 is another embodiment of the invention in which heater block 50 does not have a cavity into which the die mount pad is mounted. In the embodiment of FIG. 5, heater block 50 has a flat mounting surface 51 onto which lead frame die mount pad 53 is positioned. The edge burrs 55 of die mount pad 53 are in a moat 52 in the surface of heater block 50. Moat 52 allows die mount pad 53 to be positioned flat on mounting surface 51 with burrs 55 extending down into moat 52. Semiconductor die 54 on die mount pad 53 is connected to lead frame leads 56 via lead wires 57.

What is claimed:

1. An improved wire bond station for accommodating irregularities on the edges of the lead frame die mount pad, comprising:

a wire bond station including a heater block;

a lead frame die mount pad cavity, having a bottom surface, in said heater block; and a platform, having a top surface, in the die mount pad cavity for supporting a lead frame die mount pad, during bonding, such that the edges of the lead frame die mount pad, and irregularities thereon, extend beyond the top surface of the platform and are spaced above the bottom surface of said die mount pad cavity.

2. The improved bond station according to claim 1, wherein the platform has a top surface the periphery of which is smaller than the periphery of a lead frame die mount pad mounted on the platform during wire bonding.

3. The improved bond station according to claim 1, wherein said platform is a raised surface in the die mount cavity.

4. The improved bond station according to claim 1, wherein said platform has a moat surrounding the platform top surface, said moat extending down into the bottom surface of the die mount cavity in the heater block.

5. The improved bond station according to claim 4, wherein irregularities on the edges of a lead frame die mount pad and supporting tie straps, when the die mount pad is placed on said platform, extend down into and are spaced from sides of said moat.

6. An improved wire bond station for accommodating irregularities on the edges of the lead frame die mount pad, comprising:

a wire bond station including a heater block;

a lead frame die mount pad mounting surface, having a bottom surface, in said heater block; and a raised platform, having a top surface, in the die mount pad cavity for supporting a lead frame die mount pad, during bonding, such that the edges of the lead frame die mount pad, and irregularities thereon, extend beyond the top surface of the platform and are spaced above the bottom surface of said die mount pad cavity.

7. The improved bond station according to claim 6, wherein the platform has a top surface the periphery of which is smaller than the periphery of a lead frame die mount pad mounted on the platform during wire bonding.

8. The improved bond station according to claim 6, wherein said platform has a moat surrounding the platform top surface, said moat extending down into the bottom surface of the die mount cavity in the heater block.

9. An improved wire bond station for accommodating irregularities on the edges of the lead frame die mount pad, comprising:

a wire bond station including a heater block;

a mounting surface on said heater block having a top surface for supporting a lead frame die mount pad, during bonding, such that the edges of the lead frame die mount pad, and irregularities thereon, extend beyond the top surface of the platform; and a moat, having sides and a bottom surface, surrounding said mounting surface, extending into the bottom surface of said heater block, such that the irregularities on the edges of said lead frame die mount pad extend down into said moat, but are spaced apart from said sides and above the bottom surface of said moat.

10. The improved bonding station according to claim 9, wherein said moat has extensions to accommodate die pad tie straps.

* * * * *